United States Patent
Dong

(10) Patent No.: US 12,328,972 B2
(45) Date of Patent: Jun. 10, 2025

(54) BONDING METHOD OF MICRO-LIGHT EMITTING DIODE CHIP

(71) Applicant: Chengdu Vistar Optoelectronics Co., Ltd., Sichuan (CN)

(72) Inventor: Xiaobiao Dong, Kunshan (CN)

(73) Assignee: Chengdu Vistar Optoelectronics Co., Ltd., Chengdu (CN)

( * ) Notice: Subject to any disclaimer, the term of this patent is extended or adjusted under 35 U.S.C. 154(b) by 762 days.

(21) Appl. No.: 17/388,398

(22) Filed: Jul. 29, 2021

(65) Prior Publication Data

US 2021/0359154 A1 Nov. 18, 2021

Related U.S. Application Data

(63) Continuation of application No. PCT/CN2020/076481, filed on Feb. 24, 2020.

(30) Foreign Application Priority Data

Jun. 17, 2019 (CN) .......................... 201910521185.3

(51) Int. Cl.
*H10H 20/01* (2025.01)
*H10H 20/85* (2025.01)
*H10H 20/857* (2025.01)

(52) U.S. Cl.
CPC ...... *H10H 20/018* (2025.01); *H10H 20/8506* (2025.01); *H10H 20/857* (2025.01); *H10H 20/0364* (2025.01)

(58) Field of Classification Search
CPC ... H01L 33/62; H01L 25/0753; H01L 33/483; H01L 33/0093; H01L 2933/0066;
(Continued)

(56) References Cited

U.S. PATENT DOCUMENTS 5,001,829 A 3/1991 Schelhorn
2007/0269973 A1* 11/2007 Nalla .................. H05K 3/3478
257/E21.508
(Continued)

FOREIGN PATENT DOCUMENTS

CN 101350381 A 1/2009
CN 101728288 B 7/2011
(Continued)

OTHER PUBLICATIONS

International Search Report issued on May 29, 2020 in corresponding International application No. PCT/CN2020/076481; 5 pages.
(Continued)

*Primary Examiner* — Latanya N Crawford Eason
(74) *Attorney, Agent, or Firm* — Maier & Maier, PLLC

(57) ABSTRACT

The bonding method of a micro-light emitting diode chip includes providing a backplane, and two solder columns are formed on electrodes of each chip bonding area of the backplane; forming a glue groove in the chip bonding area, forming a glue layer in the glue groove to make the glue layer cover tops of the solder columns; moving the chip to make positive and negative electrodes of the chip aligned with the two solder columns respectively; heating the backplane to make the glue layer melt into liquid glue; making positive and negative electrodes of the chip immersed in the liquid glue; after cooling to a room temperature, making the positive electrode and the negative electrode of the chip adhered to the two solder columns respectively; removing a transfer head; soldering the positive electrode and the solder column adhered together, and the negative electrode and the solder column adhered together.

16 Claims, 2 Drawing Sheets

(58) Field of Classification Search
CPC .. H01L 23/488; H10H 20/857; H10H 29/857; H10H 29/49; H10H 29/142; H10H 29/14; H10H 29/942; H10H 29/922; H10H 20/8506; H10H 20/8502; H10H 20/8504; H10H 20/8508; H10H 20/0364; H10H 20/018

See application file for complete search history.

(56) References Cited

U.S. PATENT DOCUMENTS

| | | | | |
|---|---|---|---|---|
| 2012/0217287 | A1* | 8/2012 | Kumar | B23K 1/0016 |
| | | | | 228/232 |
| 2014/0339289 | A1* | 11/2014 | Ootorii | H05K 3/305 |
| | | | | 228/176 |
| 2015/0140738 | A1 | 5/2015 | Moriyama | |
| 2016/0336292 | A1 | 11/2016 | Tian et al. | |
| 2020/0312822 | A1* | 10/2020 | Kim | H01L 25/0753 |

FOREIGN PATENT DOCUMENTS

| | | | |
|---|---|---|---|
| CN | 103357979 | A | 10/2013 |
| CN | 107123718 | A | 9/2017 |
| CN | 107146835 | A | 9/2017 |
| CN | 107431107 | A | 12/2017 |
| CN | 107785331 | A | 3/2018 |
| CN | 108461439 | A | 8/2018 |
| CN | 109065677 | A | 12/2018 |
| CN | 109326559 | A | 2/2019 |
| CN | 109473412 | A | 3/2019 |
| CN | 109496351 | A | 3/2019 |
| CN | 109728022 | A | 5/2019 |
| CN | 109755266 | A | 5/2019 |
| KR | 20110039639 | A | 4/2011 |

OTHER PUBLICATIONS

Chinese Office Action issued on May 31, 2021 in corresponding Chinese application No. 201910521185 3; 7 pages.

* cited by examiner

BONDING METHOD OF MICRO-LIGHT EMITTING DIODE CHIP

CROSS-REFERENCE TO RELATED APPLICATIONS

This application is a continuation of International Application No. PCT/CN2020/076481, filed on Feb. 24, 2020, which claims priority to Chinese Patent Application No. 201910521185.3, filed on Jun. 17, 2019, both of which are hereby incorporated by reference in their entireties.

TECHNICAL FIELD

The present application relates to the technical field of display and, in particular, relates to a bonding method of a micro-light emitting diode chip.

BACKGROUND

Due to advantages of high brightness, high response speed, low power consumption and long life, the micro-light emitting diode (Micro-LED) display technology has gradually become a research hotspot. In the process of manufacturing a large-sized or a medium-sized Micro-LED display, a large amount of transfer and a bonding process are needed for chips. The bonding process is to connect positive and negative electrodes of the chip with an electrode metal on a backplane using solders in an electrical manner after the chip is aligned with the backplane.

There are some problems in chip bonding methods that when the positive and negative electrodes of the LED chip are bonded to the backplane, the chip and the backplane are prone to thermal mismatch, warping and affecting a lifetime of a transfer head.

SUMMARY

The embodiments of the present application provide a bonding method of a micro-light emitting diode chip, which is used to solve the problem in chip bonding methods that when the positive and negative electrodes of the LED chip are bonded to the backplane, the chip and the backplane are prone to thermal mismatch, warping and affecting the lifetime of the transfer head.

In order to achieve the above purpose, the embodiments of the present application provide the following technical solutions.

The embodiments of the present application provide a bonding method of a micro-light emitting diode chip, including:
  providing a backplane, including a plurality of chip bonding areas, and two solder columns are formed on the electrodes of each of the chip bonding areas;
  forming a glue groove in each of the chip bonding areas to make the two solder columns located in the glue groove;
  forming a glue layer in the glue groove to make the glue layer cover tops of the solder columns;
  moving the chip to make a positive electrode and a negative electrode of the chip aligned with the two solder columns respectively;
  heating the backplane to make the glue layer melt into liquid glue;
  moving the chip downward to make the positive electrode and the negative electrode of the chip immersed in the liquid glue;
  cooling to a room temperature to solidify the liquid glue, and making the positive electrode and the negative electrode of the chip adhered to the two solder columns respectively; and
  soldering the positive electrode and the solder column adhered together, and the negative electrode and the solder column adhered together.

The bonding method of the micro-light emitting diode chip provided by the embodiments of the present application has following advantages:
  a glue groove is formed in the chip bonding area of the backplane, and a glue layer is formed in the glue groove. Through adhesion of the glue layer, the positive and negative electrodes of the chip and the solder columns are first adhered together, so as to ensure relative fixation between the positive and negative electrodes and the solder columns, avoid dislocation, and ensure accurate positioning when the chip is bonded to the backplane. Therefore, the bonding method of the micro-light emitting diode chip provided by the embodiments of the present application solves the problem that when the positive and negative electrodes of the LED chip are bonded to the backplane, the chip and the backplane are prone to thermal mismatch and warping. At the same time, after the positive and negative electrodes of the chip are adhered to the solder columns, a transfer head used for picking up and moving the chip can be removed, thus avoiding impact on the lifetime of the transfer head during subsequent heating.

DETAILED DESCRIPTION OF THE EMBODIMENTS

Solders usually include high melting point solders and low melting point solders. When using the high melting point solder for soldering, it is generally necessary to heat the solder to above 100° C. to melt the solder, so as to connect a chip with a backplane, however, due to a high heating temperature, it is easy to cause dislocation and poor connection effects caused by thermal mismatch, and will reduce the lifetime of a transfer head; when using a low melting point solder for soldering, since the chip will generate heat during use, it is easy to cause the low melting point solder to re-melt, leading to the problem of electrical connection failures.

The bonding method of the micro-light emitting diode chip has the problems that when positive and negative electrodes of the LED chip are bonded to the backplane, the chip and the backplane are prone to thermal mismatch, warping and affecting the lifetime of the transfer head.

In view of the foregoing problems, the embodiments of the present application provide an improved bonding method of the micro-light emitting diode chip, including: forming a glue groove in each chip bonding area of a backplane, forming a glue layer in the glue groove, using a transfer head to pick up and move the chip to make positive and negative electrodes of the chip aligned with the two solder columns respectively; heating the backplane to make the glue layer melt into liquid glue; pressing down the transfer head to make the positive electrode and the negative electrode of the chip immersed in the liquid glue; cooling to a room temperature to solidify the liquid glue, and making the positive electrode and the negative electrode of the chip adhered to the two solder columns respectively; removing the transfer head; soldering the positive electrode and the solder column adhered together, and the negative electrode and the solder column adhered together. The bonding method of the micro-light emitting diode chip provided by the embodiments of the present application solves the problem in the related art that when the positive and negative electrodes of the LED chip are bonded to the backplane, the chip and the backplane are prone to thermal mismatch, warping and affecting the lifetime of the transfer head.

Please refer to FIG. 1 to FIG. 4, the embodiments of the present application provide a bonding method of a micro-light emitting diode chip, including the following steps.

Step 1: providing a backplane 20, where the backplane 20 includes a plurality of chip bonding areas 60, and two solder columns 21 are formed on electrodes 50 of each of the chip bonding areas 60.

Figure 1:
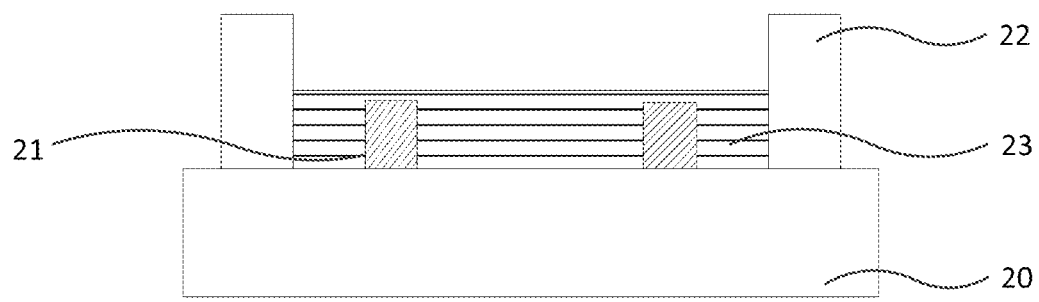
FIG. 1 is a schematic structural diagram 1 of bonding between a chip and a backplane in the embodiments of the present application.
Figure 3:
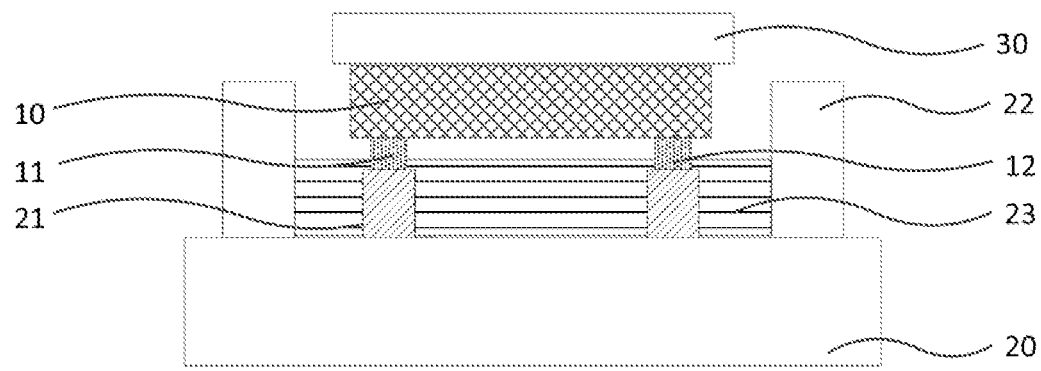
FIG. 3 is a schematic structural diagram 3 of bonding between a chip and a backplane in the embodiments of the present application.

As shown in FIG. 1 and FIG. 3, the backplane 20 in the embodiments of the present application includes a plurality of chip bonding areas, and each of the chip bonding areas is used for bonding with one chip 10. Two solder columns 21 are formed on the electrodes of each of the chip bonding areas, and the solder columns 21 can be formed through processes such as metal thermal evaporation, lift-off, and the like. In one implementation, the solder columns 21 may be made of a high melting point solder. In the embodiments of the present application, the high melting point solder refers to a conventional solder with a melting point above 150° C., such as indium or tin. The use of the high melting point solder can prevent melting caused by heating during use, thereby preventing an electrical connection between the chip 10 and the backplane 20 from failing.

Step 2: forming a glue groove 22 between the two solder columns 21 in each of the chip bonding areas to make the two solder columns 21 located in the glue groove 22.

As shown in FIG. 1, the glue groove 22 is formed in the chip bonding area of the backplane 20. The glue groove 22 has an opening, and a side wall of the glue groove 22 is set as a colloid, the colloid can be photoresist, and a bottom of the glue groove 22 is a surface of the backplane 20 facing the chip. In the embodiments of the present application, the glue groove 22 is used to provide an accommodating space for subsequent formation of the glue layer, and at the same time to prevent the glue layer from flowing after melting into liquid glue.

In addition, the glue groove 22 in the embodiments of the present application is a groove made of photoresist.

Step 3: forming a glue layer 23 in the glue groove 22 to make the glue layer 23 cover the tops of the solder columns 21.

The formation manner of forming the glue layer 23 in the glue groove 22 may be spin coating or inkjet printing. In the embodiments of the present application, a melting point of the glue layer 23 is 50° C.-60° C., and the melting point of the glue layer 23 is lower than a melting point of glue groove 22. In the embodiments of the present application, the glue layer 23 is used to provide adhesion between the positive and negative electrodes of the chip and the solder columns 21 in the chip bonding area on the backplane 20, so that the positive and negative electrodes of the chip and the solder columns 21 in the chip bonding area on the backplane 20 are relatively fixed before soldering, so as to prevent dislocation during soldering and ensure the accuracy of positioning during soldering. Taking a side of the backplane 20 facing the chip as a reference, a height of the glue layer 23 is higher than a height of the solder columns 21. This arrangement ensures that the positive and negative electrodes of the chip and the solder columns 21 can be located in the glue layer 23 at the same time, which is convenient for the positive electrode 11 and the solder column 21, the negative electrode 12 and the solder column 21 to adhere to each other respectively.

Step 4: moving the chip 10 to make a positive electrode 11 and a negative electrode 12 of the chip 10 aligned with the two solder columns 21 respectively.

Figure 2:
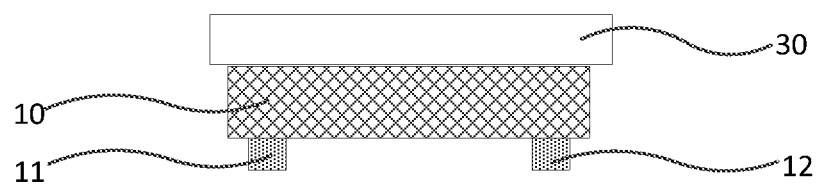
FIG. 2 is a schematic structural diagram 2 of bonding between a chip and a backplane in the embodiments of the present application.

In the embodiments of the present application, as shown in FIG. 2, a transfer head 30 can be used to pick up and move the chip 10. For example, the transfer head 30 picks up the chip 10 firstly, and then drives the chip 10 to move above the chip bonding area of the backplane 20, so that the positive electrode 11 of the chip 10 is aligned with one solder column 21, and the negative electrode 12 of the chip 10 is aligned with the other solder column 21.

Step 5: heating the backplane 20 to make the glue layer 23 melt into liquid glue.

As shown in FIG. 3, after the positive electrode 11 and the negative electrode 12 of the chip 10 are aligned with the solder columns 21 respectively, the backplane 20 is heated first to increase the temperature until the glue layer 23 melts into liquid glue. In the embodiments of the present application, since the glue layer 23 used has a low melting point, when the backplane 20 is heated, the solder columns 21 and the glue groove 22 located on the backplane 20 will not be heated to melt.

Step 6: moving the chip 10 downward to make the positive electrode 11 and the negative electrode 12 immersed in the liquid glue.

On the basis of the above embodiments, the transfer head 30 can be used to drive the chip 10 to move downward, so that the positive electrode 11 and the negative electrode 12 are immersed in the liquid glue. At this time, the part of the positive electrode 11 in contact with the solder column 21 and the part of the negative electrode 12 in contact with the solder column 21 are all immersed in the liquid glue to ensure that they can be adhered to each other later.

Step 7: cooling to a room temperature to solidify the liquid glue, and making the positive electrode 11 and the negative electrode 12 of the chip adhered to the two solder columns 21 respectively.

In the embodiments of the present application, the chip 10 and the backplane 20 are first cooled to the room temperature, so that the liquid glue in the glue groove 22 is solidified again to form the glue layer 23. At the same time, the glue layer 23 in a solidified state adheres the positive electrode 11 to the solder column 21, and the negative electrode 12 to the solder column 21 so that the chip 10 and the backplane 20 are relatively fixed, so as to avoid dislocation during subsequent soldering.

On the basis of the above embodiment, after the positive electrode 11 and the negative electrode 12 are respectively adhered to the two solder columns 21, the transfer head 30 is removed; since the chip 10 and backplane 20 are relatively fixed, the transfer head 30 can be removed in the embodiments of the present application; since the solder columns 21 are high-temperature solders, when the solder columns 21 are connected to the positive electrode 11 and the negative electrode 12, they need to be heated to a temperature equal to or above the melting point of the solder columns 21, therefore, the removing of the transfer head 30 ensures that the lifetime of the transfer head 30 will not be affected by an excessively high soldering temperature when the positive electrode 11, the negative electrode 12 and the solder columns 21 are subsequently welded.

Step 8: soldering the positive electrode 11 and the solder column 21 adhered together, and the negative electrode 12 and the solder column 21 adhered together.

In the embodiments of the present application, the soldering process is a flip-chip soldering process and a reflow soldering process. After the transfer head 30 is removed, the backplane 20 is heated first to melt the solder columns 21, so that the solder columns 21 are further electrically connected to the positive electrode 11 and the negative electrode 12 of the chip 10 adhered thereto. Then, the reliability of the connection between the chip 10 and the backplane 20 can be further improved through the reflow soldering process.

In summary, in the bonding method of the chip 10 provided by the embodiments of the present application, a glue groove 22 is formed in the chip bonding area of the backplane 20, a glue layer 23 is formed in the glue groove 22, the positive electrode 11 and the negative electrode 12 of the chip 10 and the solder columns 21 are adhered together first through the adhesion of the glue layer 23, so as to ensure the relative fixation between the positive electrode 11, the negative electrode 12 and the solder columns 21, avoid dislocation, and ensure the accurate positioning when the chip 10 is bonded to the backplane 20. And after adhesion, the transfer head 30 used for picking up and moving the chip 10 can be removed, after removing the transfer head 30, the backplane 20 is heated to connect the positive electrode 11 with the solder column 21, and the negative electrode 12 with the solder column 21, thus avoiding the impact of high temperature on the transfer head 30. Therefore, the bonding method of the chip provided by the embodiments of the present application solves the problem in the related art that when the positive and negative electrodes of the chip are bonded to the backplane, the chip and the backplane are prone to thermal mismatch, warping and affecting the lifetime of the transfer head.

In a possible implementation, two solder columns 21 are formed on the electrodes of the chip bonding area using the following method: forming two solder columns 21 on the electrodes of the chip bonding area through a metal thermal evaporation process.

In a possible implementation, the solder columns 21 are high melting point solder columns, and the high melting point solder columns are indium solder columns or tin solder columns. The embodiments of the present application use high melting point solders, thus preventing the solders from melting due to heat generation of the chip 10 during subsequent use.

In a possible implementation, the forming the glue groove 22 in each of the chip bonding areas includes: spin coating photoresist on a side of the backplane 20 where the solder columns 21 are arranged; and baking, exposing, developing and hard drying photoresist to form the glue groove 22.

In a possible implementation, when taking a plane parallel to the chip 10 and the backplane 20 as a cross section, a cross-sectional area of an opening of the glue groove 22 is larger than a cross-sectional area of the chip 10. In the embodiments of the present application, the cross-sectional area of the opening of the glue groove 22 is larger than the cross-sectional area of the chip 10, thereby ensuring that the chip 10 can extend into the glue groove 22 to make the positive electrode 11 and the negative electrode 12 respectively adhered to the solder columns 21 on the backplane 20.

In a possible implementation, the forming the glue layer 23 in the glue groove 22 includes: inkjet printing a low melting point polymer in the glue groove 22 to form the glue layer 23. In the embodiments of the present application, the manner for forming the glue layer 23 is inkjet printing, and the glue layer 23 is formed by inkjet printing a low melting point polymer in the glue groove 22.

In a possible implementation, the low melting point polymer is polyethylene glycol. For example, polyethylene glycol PEG-2000 can be used, polyethylene glycol is a non-ionic water-soluble polymer, and PEG-2000 can be used as a soldering agent or a hot melt adhesive. In addition, the embodiments of the present application may also use other polymers that meet the low melting point requirement.

In a possible implementation, the soldering the positive electrode 11 and the solder column 21 adhered together, and the negative electrode 12 and the solder column 21 adhered together includes: providing a hard pressing plate 40, and pressing the hard pressing plate 40 on a side of the chip 10 away from the backplane 20; heating the backplane 20 to melt the solder columns 21, pressing down the hard pressing plate 40 to connect the positive electrode 11 and the negative electrode 12 with the solder columns 21 respectively; and cooling to a room temperature and removing the hard pressing plate 40.

Figure 4:
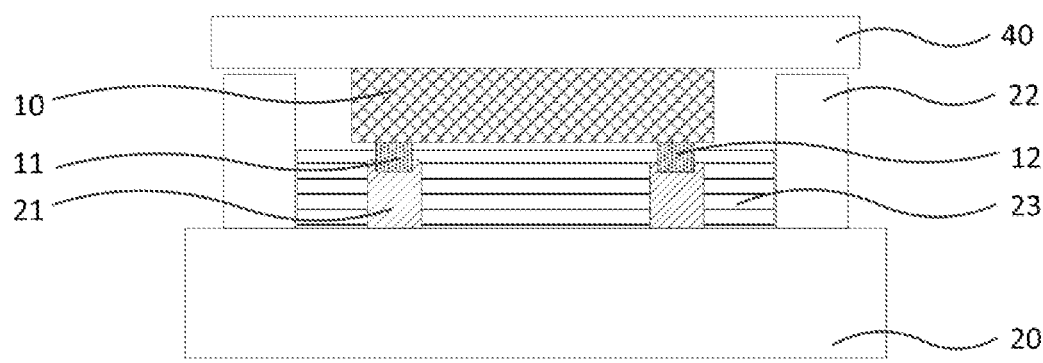
FIG. 4 is a schematic structural diagram 4 of bonding between the chip and the backplane in the embodiments of the present application.

The hard pressing plate 40 can be a hard resin plate or a hard glass plate. As shown in FIG. 4, after the positive electrode 11 and the negative electrode 12 are adhered to the solder columns 21 respectively, further soldering is required to make the positive electrode 11 and the negative electrode 12 electrically connect with the solder columns 21 respectively. In the embodiments of the present application, while heating the backplane 20 and the solder columns 21, a force directing towards the backplane 20 is applied to the chip 10 by pressing the hard pressing plate 40 on the side of the chip 10 away from the backplane 20, so that the solder columns 21 are melted and soldered with the positive electrode 11 and the negative electrode 12 adhered thereto, thereby achieving electrical connections. In the embodiments of the present application, the reliability of the connections between the positive electrode 11 and the solder column 21, the negative electrode 12 and the solder column 21 is ensured by using the hard pressing plate 40 to act on the chip 10.

In a possible implementation, the bonding method of the chip 10 further includes removing the glue layer 23 after the positive electrode 11 and the solder column 21 adhered together, and the negative electrode 12 and the solder column 21 adhered together are soldered. In the embodiments of the present application, the glue layer 23 can be removed by cleaning with a solvent, and the solvent used for cleaning can be water or ethanol. For example, if the glue layer 23 is made of polyethylene glycol, since polyethylene glycol is a water-soluble polymer, the glue layer 23 can be cleaned by water.

In a possible implementation, the bonding method of the chip 10 further includes performing reflow soldering on the chip 10 and the backplane 20 after removing the glue layer 23. Reflow soldering can further improve the stability of the connections between the positive electrode 11, the negative electrode 12 and the solder columns 21 respectively, thereby improving the reliability of the electrical connection between the chip 10 and the backplane 20.

The above embodiments are only used to illustrate the technical solutions of the present application, not to limit them; although the present application has been described in detail with reference to the foregoing embodiments, those of ordinary skill in the art should understand that they can still modify the technical solutions described in the foregoing embodiments, or equivalently replace some or all of the technical features therein; however, these modifications or replacements do not cause the essence of the corresponding technical solutions to deviate from the scope of the technical solutions of the embodiments of the present application.

What is claimed is:

1. A bonding method of a micro-light emitting diode chip, comprising:
    providing a backplane comprising a plurality of chip bonding areas, and two solder columns are formed on electrodes of each of the chip bonding areas;
    forming a glue groove in each of the chip bonding areas to locate the two solder columns in the glue groove;
    forming a glue layer in the glue groove to make the glue layer cover tops of the solder columns, wherein a melting point of the glue layer is lower than a melting point of the glue groove and a height of the glue layer is higher than a height of the two solder columns when taking a side of the backplane facing the chip as a reference;
    moving the chip to make a positive electrode and a negative electrode of the chip aligned with the two solder columns, respectively;
    heating the backplane to make the glue layer melt into liquid glue;
    moving the chip downward to make the positive electrode and the negative electrode of the chip immersed in the liquid glue;
    cooling, to a room temperature, to solidify the liquid glue, and adhering the positive electrode and the negative electrode of the chip to the two solder columns, respectively; and
    soldering the positive electrode and the solder column together, and soldering the negative electrode and the solder column together.

2. The bonding method of the micro-light emitting diode chip according to claim 1, wherein the two solder columns are formed on the electrodes of the chip bonding area by the following method:
    forming the two solder columns on the electrodes of the chip bonding area through a metal thermal evaporation or lift-off process.

3. The bonding method of the micro-light emitting diode chip according to claim 2, wherein the solder columns are high melting point solder columns.

4. The bonding method of the micro-light emitting diode chip according to claim 3, wherein the high melting point solder columns are indium solder columns or tin solder columns.

5. The bonding method of the micro-light emitting diode chip according to claim 1, wherein the forming of the glue groove in each of the chip bonding areas further comprises:
    spin coating or inkjet printing photoresist on a side of the backplane where the solder columns are arranged; and
    baking, exposing, developing and hard drying the photoresist to form the glue groove.

6. The bonding method of the micro-light emitting diode chip according to claim 1, wherein a cross-sectional area of an opening of the glue groove is larger than a cross-sectional area of the chip when taking a plane parallel to the chip and the backplane as a cross section.

7. The bonding method of the micro-light emitting diode chip according to claim 1, wherein the forming of the glue layer in the glue groove comprises:
    spin coating or inkjet printing a low melting point polymer in the glue groove to form the glue layer.

8. The bonding method of the micro-light emitting diode chip according to claim 7, wherein the low melting point polymer is polyethylene glycol.

9. The bonding method of the micro-light emitting diode chip according to claim 1, wherein the moving of the chip to make a positive electrode and a negative electrode of the chip aligned with the two solder columns, respectively, comprises:
    picking up the chip with a transfer head; and
    using the transfer head to drive the chip to move above the chip bonding area, so that the positive electrode of the chip is aligned with one of the two solder columns, and the negative electrode of the chip is aligned with the other one of the two solder columns.

10. The bonding method of the micro-light emitting diode chip according to claim 1, wherein the soldering of the positive electrode and the solder column together, and the soldering of the negative electrode and the solder column together comprises:
    soldering the positive electrode and the solder column adhered together, and the negative electrode and the solder column adhered together by adopting a flip-chip soldering process and a reflow soldering process.

11. The bonding method of the micro-light emitting diode chip according to claim 1, wherein the soldering of the positive electrode and the solder column together, and the soldering of the negative electrode and the solder column together comprises:
    providing a hard pressing plate, and pressing the hard pressing plate on a side of the chip away from the backplane;
    heating the backplane to melt the solder columns, pressing down the hard pressing plate to connect the positive electrode and the negative electrode of the chip with the solder columns respectively; and
    cooling to the room temperature and removing the hard pressing plate.

12. The bonding method of the micro-light emitting diode chip according to claim 11, wherein the hard pressing plate is a hard resin plate or a hard glass plate.

13. The bonding method of the micro-light emitting diode chip according to claim 1, wherein the bonding method of the chip further comprises removing the glue layer after soldering the positive electrode and the solder column adhered together, the negative electrode and the solder column adhered together.

14. The bonding method of the micro-light emitting diode chip according to claim 13, wherein the removing of the glue layer comprises:
    removing the glue layer by cleaning with a solvent.

15. The bonding method of the micro-light emitting diode chip according to claim 14, wherein the solvent is water or ethanol.

16. The bonding method of the micro-light emitting diode chip according to claim 13, wherein the bonding method of the chip further comprises performing reflow soldering on the chip and the backplane after removing the glue layer.

* * * * *